(12) United States Patent
Liu et al.

(10) Patent No.: US 7,642,101 B2
(45) Date of Patent: Jan. 5, 2010

(54) SEMICONDUCTOR DEVICE HAVING IN-CHIP CRITICAL DIMENSION AND FOCUS PATTERNS

(75) Inventors: George Liu, Sin-Chu (TW); Vencent Chang, Hsin-Chu (TW); Chin-Hsiang Lin, Hsin-Chu (TW); Kuei Shun Chen, Hsin-Chu (TW); Norman Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 204 days.

(21) Appl. No.: 11/567,055

(22) Filed: Dec. 5, 2006

(65) Prior Publication Data

US 2008/0128924 A1 Jun. 5, 2008

(51) Int. Cl.
*H01L 21/66* (2006.01)
*G01R 31/26* (2006.01)
(52) U.S. Cl. .......................................... 438/14; 438/551
(58) Field of Classification Search .................... 438/14, 438/551–558, E21.529
See application file for complete search history.

(56) References Cited

U.S. PATENT DOCUMENTS 6,884,552 B2 * 4/2005 Mieher et al. .................. 430/5

* cited by examiner

*Primary Examiner*—Cuong Q Nguyen
(74) *Attorney, Agent, or Firm*—Haynes and Boone, LLP

(57) ABSTRACT

A semiconductor device is fabricated to include one or more sets of calibration patterns used to measure line pitch and line focus.

14 Claims, 8 Drawing Sheets

SEMICONDUCTOR DEVICE HAVING IN-CHIP CRITICAL DIMENSION AND FOCUS PATTERNS

BACKGROUND

The present disclosure relates in general to integrated circuit manufacturing, and more particularly, to in-chip monitoring patterns and a method for forming such patterns.

In integrated circuit (IC) manufacturing technology, a photoresist layer is typically applied to a semiconductor wafer surface, followed by an exposure of the photoresist through a mask. A post-exposure baking process is then performed to alter physical properties of the photoresist for subsequent processing. An after development inspection (ADI) is then performed to inspect the critical dimension (CD) of the photoresist using a metrological system to determine whether it conforms to a specification. If the photoresist is within specification, a pattern is etched or transferred and the photoresist is stripped. An after etching inspection (AEI) is then performed on the wafer. Following inspection, the wafer is then typically cut along scribe lines to define a plurality of device modules, which can than be used to form various electronic components.

Increasingly, there is a desire to decrease the minimum feature sizes of very-large-scale integration (VLSI). Accordingly, lithography processes must provide precise CD control of photoresist patterns to avoid fluctuations in threshold voltages and line resistances associated with variations in pattern sizes that ultimately degrade circuit performance. To measure the variations in pattern sizes, scanning electron microscope (SEM), optical critical dimension (OCD), and other measurement processes are often used to assess the critical dimensions of a fabricated workpiece.

In conventional metrological techniques, a test workpiece, such as a semiconductor wafer, with a test pitch is used for calibrating metrological tools. This is achieved by having the metrological tool measure the pitch of the test wafer, which is a known value. If the measured pitch differs from the known pitch, the metrological tool is in need of calibration. The pitch of the test wafer is generally on the order of a couple hundred nanometers, e.g., 180 nm. In this regard, if the measured pitch differs from the known pitch by more than a given tolerance, the metrological tool must be recalibrated or any measurements taken by the metrological tool will be askew.

Conventional CD control, as discussed above, utilizes calibration lines on a test wafer. However, because of the scale at which semiconductor device features are fabricated, variations between the test wafer and the production wafer can be dramatic. Moreover, CD patterns only measure the pitch between calibration lines and thus, do not provide an indication of device feature focus. That is, the pitch measured with conventional monitoring patterns is independent of photolithographic focus.

Therefore, it would be desirable to have an in-chip CD calibration pattern. It would also be desirable to have a calibration pattern that can be used to determine chip focus.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the appended drawings illustrate only typical embodiments of this invention and are therefore not to be considered limiting in scope, for the invention may apply equally well to other embodiments.

DETAILED DESCRIPTION

Figure 1:
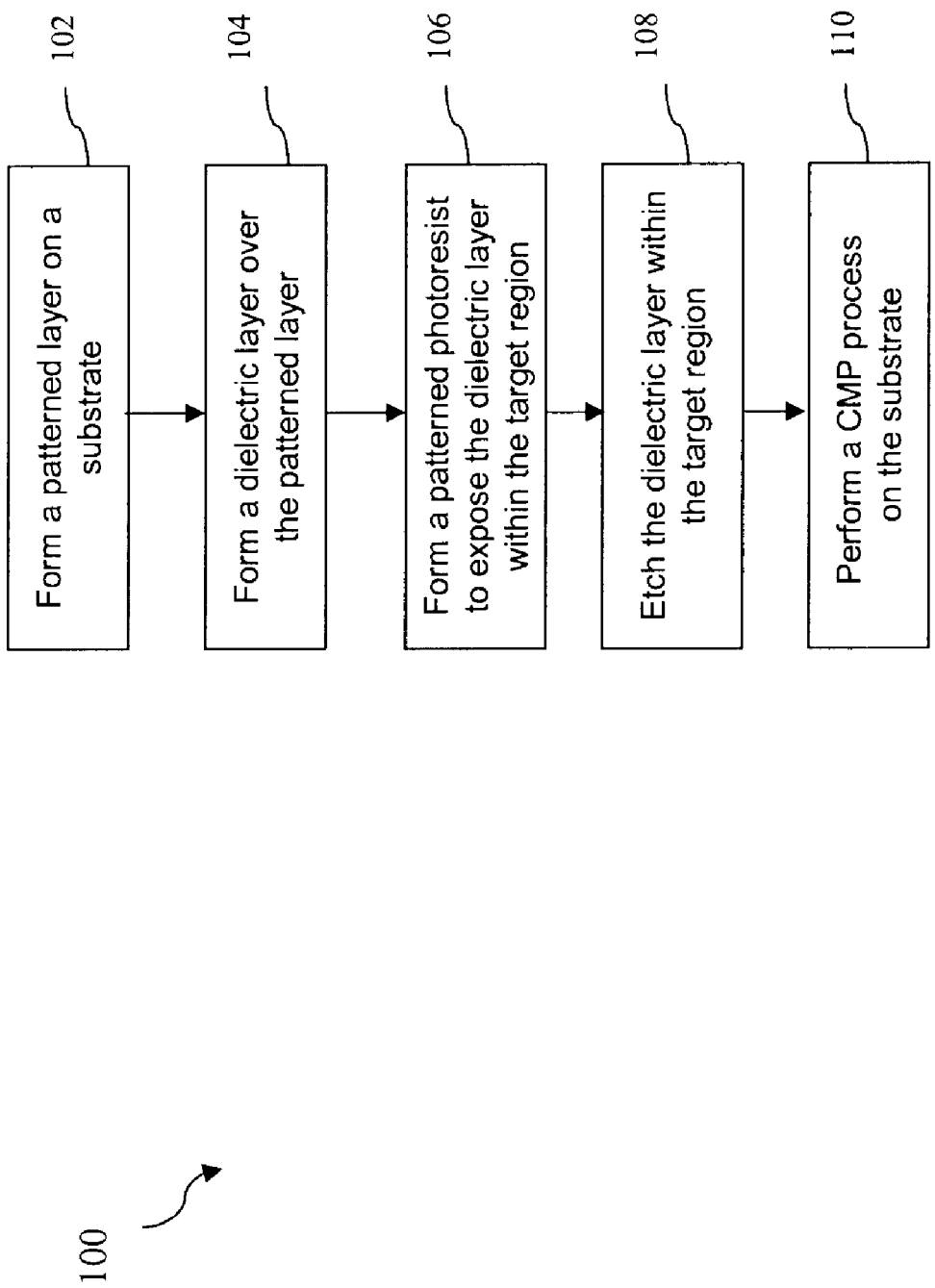
FIG. 1 is a flowchart of one embodiment of a method to form an integrated circuit (IC).
Figure 2:
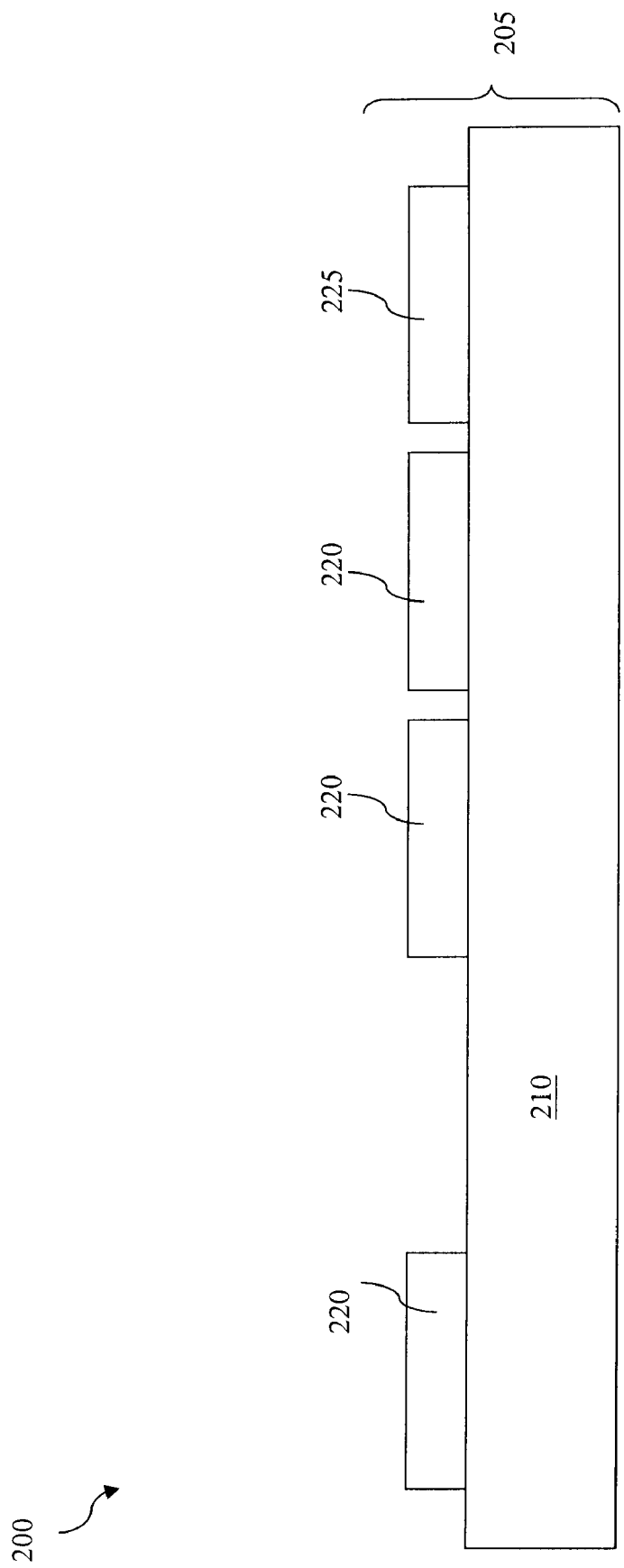
FIGS. 2 through 6 illustrate sectional side views of an exemplary integrated circuit during various fabrication stages, made by the method of FIG. 1.

For the purposes of promoting an understanding of the principles of the invention, reference will now be made to the embodiments, or examples, illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates. Furthermore, the depiction of one or more elements in close proximity to each other does not otherwise preclude the existence of intervening elements. Also, reference numbers may be repeated throughout the embodiments, and this does not by itself indicate a requirement that features of one embodiment apply to another embodiment, even if they share the same reference number.

FIG. 1 is a flowchart of one embodiment of a method 100 to form an integrated circuit. FIGS. 2 through 6 illustrate sectional side views of an exemplary integrated circuit 200 during various fabrication stages and made by the method 100. With reference to FIGS. 1 through 6, the method 100 and the exemplary integrated circuit 200 are collectively described below. It is understood that additional steps can be provided before, during, and after the method 100, and some of the steps described below can be replaced or eliminated, for additional embodiments of the method.

The method begins at step 102 by providing a wafer 200. The wafer 200 includes a substrate 210. The substrate 210 includes silicon. Alternatively, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. The substrate 210 may include an epitaxial layer. For example, the substrate may have an epitaxial layer overlying a bulk semiconductor. Furthermore, the substrate 210 may include a semiconductor-on-insulator (SOI) structure. For examples, the substrate may include a buried oxide (BOX) layer formed by a process such as separation by implanted oxygen (SIMOX). The substrate 210 may include various p-type doped regions and/or an n-type doped regions, implemented by a process such as ion implantation and/or diffusion. These doped regions in the substrate 210 may provide various functional devices or features such as metal-oxide-silicon (MOS) transistor, an imaging sensor, and combinations thereof. The substrate 210 may include lateral isolation features disposed to separate various devices formed on the substrate 210. The substrate 210 may further at least partially include a plurality of patterned dielectric layers and patterned conductive layers combined to form interconnections configured to couple the various p-type and n-type doped regions and the other functional features. For example, the substrate 210 may include a portion of a multi-layer interconnect (MLI) structure and an inter-level dielectric (ILD) disposed in the MLI structure.

In one embodiment, the substrate 210 may additionally include various dummy features to improve chemical mechanical polishing (CMP) processing performance, global substrate surface flatness, and wafer bonding quality. The various dummy features may include a dummy gate, a dummy isolation feature, a dummy metal line, a dummy metal plug, and/or a dummy device such as a dummy transistor. The various dummy features may be disposed in various open areas in the substrate 210. For example, a dummy feature may be disposed in a device region such as in an IC die to unify pattern density. A dummy feature may be alternatively or additionally disposed in a scribe-line area and/or a frame area, and may be further incorporated with a test pattern, a monitor pattern, an online measurement pattern, and/or a wafer level reliability (WLR) test pattern for pattern density uniformity. A dummy metal pattern may be disposed in various metal layers and have proper dimension for other fabrication and performance consideration including mechanical stress and electrical coupling. The various dummy features are formed simultaneously with associated IC features. For example, a dummy metal feature may be formed with functional interconnect features.

At step 102, a top conductive layer is formed on the substrate 210 and patterned to have a plurality of top conductive features 220. For example, the top conductive features 220 may comprise aluminum, aluminum/silicon/copper alloy, titanium, titanium nitride, tungsten, or combinations as used in 0.18 mm or larger technology nodes. The top conductive layer may have a thickness ranging from about 5K angstrom to about 15K angstrom. In one example, the top conductive layer has a thickness about 8K angstrom. The top conductive layer may be deposited by sputtering, chemical vapor deposition (CVD), or combinations thereof. Other manufacturing processes, including photolithography and etching, may be used to pattern the conductive materials to form the plurality of top conductive features 220. The top conductive features 220 may alternatively or additionally include other proper materials disposed and patterned on the substrate 210.

In one embodiment, one or more dummy conductive features 225 are formed on the substrate 210 along with the formation of the top conductive features 220. The dummy conductive feature 225 may be disposed in various open areas in the substrate 210 for pattern density uniformity. For example, the dummy conductive features 225 may be disposed in device regions, as shown and will be described with respect to FIG. 7. The dummy conductive features 225 may be alternatively or additionally disposed in a scribe-line area and/or a frame area, and may be further incorporated with a test pattern, a monitor pattern, an online measurement pattern, and/or a WLR test pattern. The dummy conductive feature 225 is formed with the top conductive features 220. Thus formed top dummy conductive features 225 are capable to improve chemical mechanical polishing (CMP) processing performance, substrate surface flatness, and wafer bonding quality when the wafer 205 is bonded to another wafer.

Figure 3:
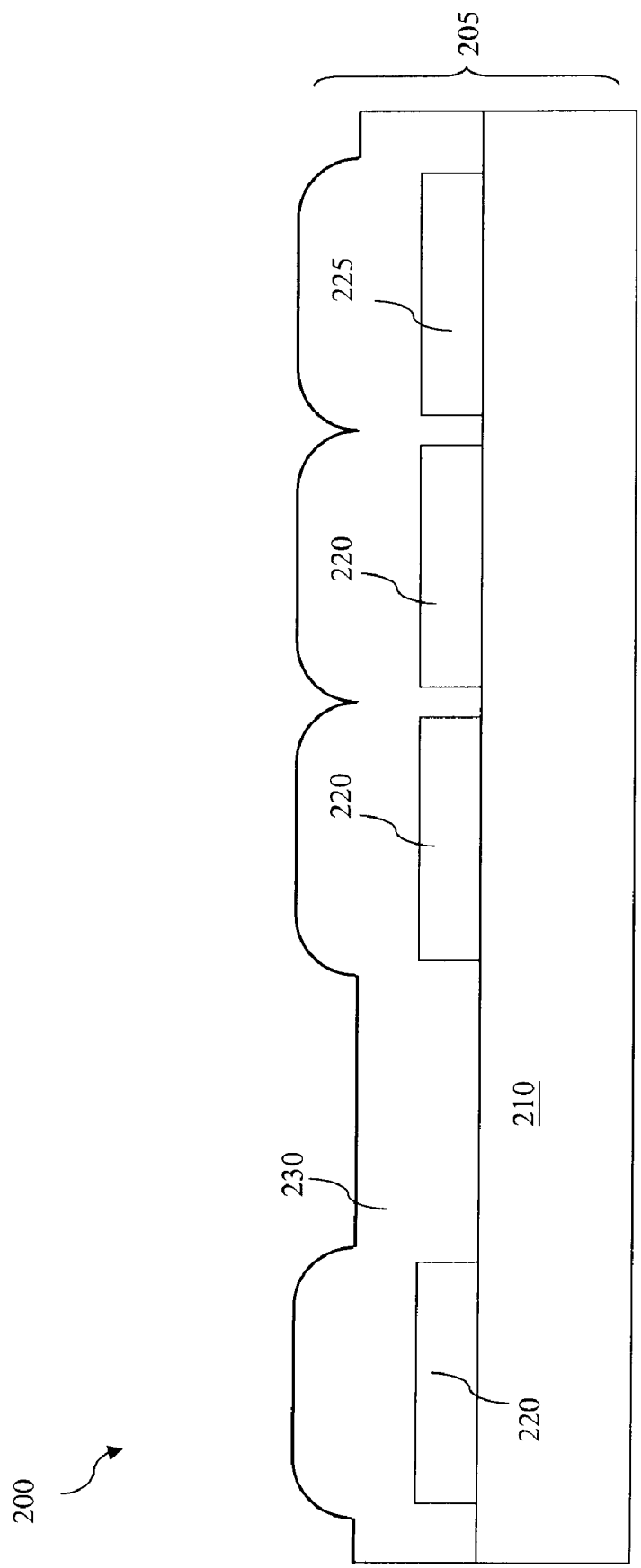

Referring to FIGS. 1 and 3, the method 100 proceeds to step 104 in which a dielectric layer 230 is formed over the patterned top conductive features 220 and the top dummy conductive features 225, if any. The formed dielectric layer has a profile at least partially conformal to the profile of the patterned top conductive layer, resulting in a bumpy surface. For example, the dielectric layer 230 may include dip regions within the openings of the patterned top conductive layer and form ridge regions overlying the top conductive features 220 and/or the dummy conductive feature 225.

In one embodiment, the dielectric layer 230 includes silicon oxide. Alternatively, the dielectric layer 230 may include silicon nitride, silicon oxynitride, a low dielectric constant (low k) material, a combination thereof, or a combination with silicon oxide. The low k material may include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other materials as examples. The dielectric layer 230 may have a thickness ranging between about 10K angstrom and about 30K angstrom to fully fill the openings of the patterned top conductive layer and reach above the patterned top conductive features. In one example, the dielectric layer has a thickness about 16K angstrom.

A process of forming the dielectric layer 230 may utilize a chemical vapor deposition (CVD) or a spin-on coating process. In one embodiment, a high density plasma chemical vapor deposition (HDPCVD) is implemented to form the silicon oxide dielectric layer.

Figure 4:
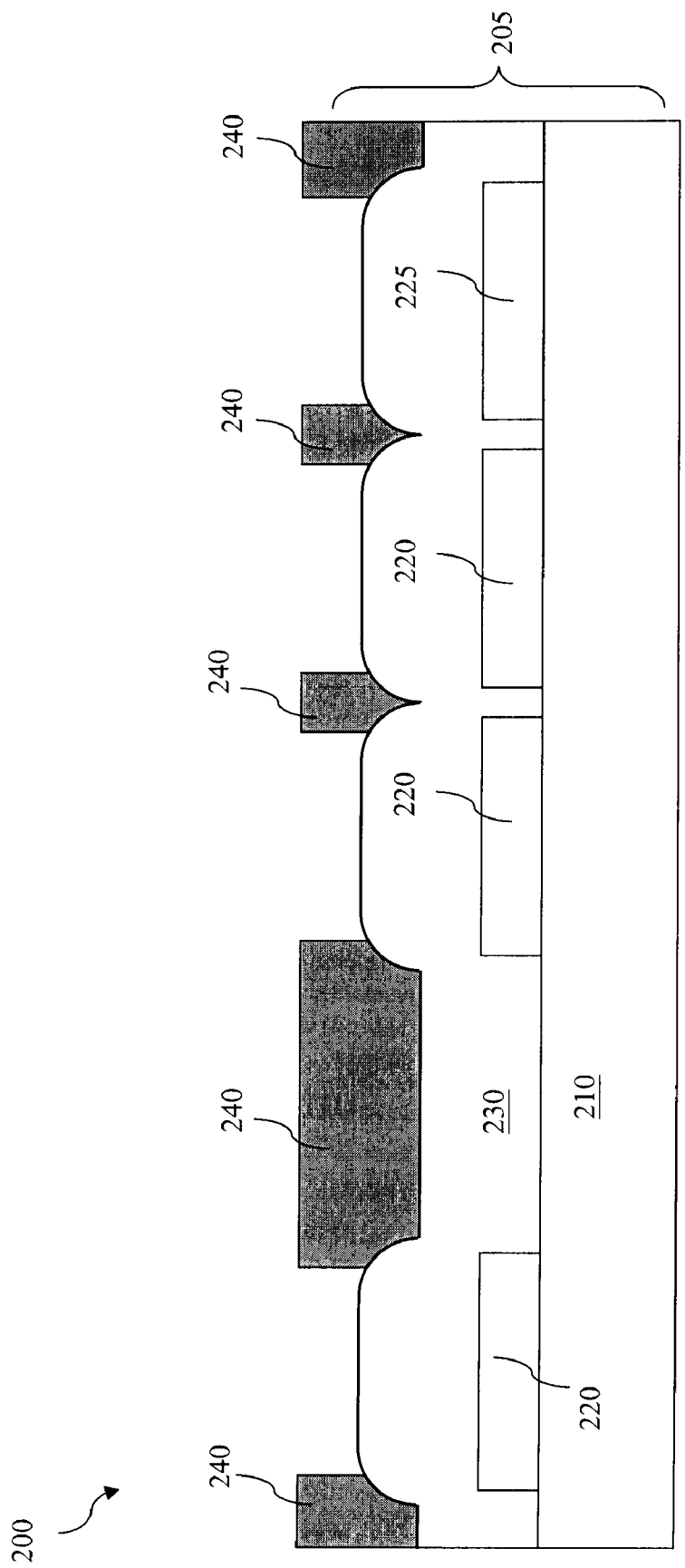

Referring to FIGS. 1 and 4, at step 106 of the method 100, a photoresist layer 240 is applied and patterned on the dielectric layer 230 such that the openings of the patterned photoresist layer 240 substantially expose the dielectric layer 230 in a target region aligned to the plurality of top conductive features 220. In another embodiment, the patterned photoresist layer 240 is formed with openings exposing the dielectric layer 230 in a target region substantially aligns to the plurality of top conductive features 220 and the top dummy conductive feature 225. In one example, the photoresist layer may be applied on the dielectric layer 230 by a spin-on coating and patterned by a lithography process including exposing thereof to a radiation beam. The radiation beam may be a photon beam. For example, the resist layer on a semiconductor wafer may be exposed to an ultraviolet (UV) light through a mask having a predefined pattern. The exposing process may be implemented using a stepper by a step-and-repeat method or using a scanner by a step-and-scan method. An exemplary photolithography process to form a patterned photoresist layer may include processing steps of photoresist coating, soft baking, mask aligning, exposing pattern, post-exposure baking, developing photoresist, and hard baking. The photolithography process may be implemented or replaced by other proper methods such as maskless photolithography, electron-beam writing, ion-beam writing, and molecular imprint.

Figure 5:
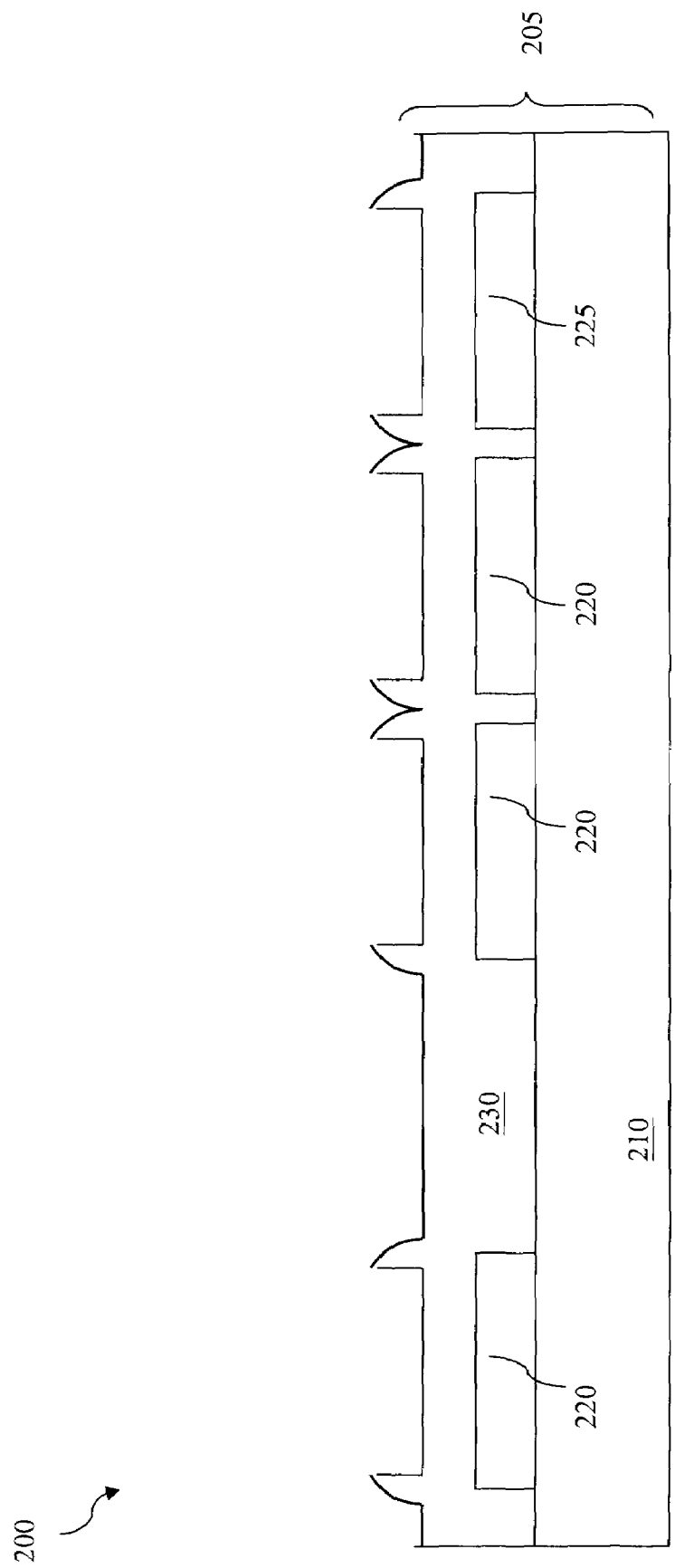

Referring to FIGS. 1 and 5, at step 108 of the method 100, the dielectric layer 230 exposed within the openings of the patterned photoresist layer 240 is etched such that the dielectric layer within the target region is substantially recessed level with the dielectric layer in the dip regions. For example, with the top conductive layer of about 8K angstrom thickness and the dielectric layer of about 16K angstrom thickness, the etching process may substantially reduce the dielectric layer within the target region of about 9K angstrom. The etching process may include a wet etching and/or a dry etching. Wet etching may be an isotropic etching method. For example, a buffered hydrofluoric acid (BHF) solution may be used to etch the dielectric layer 230 made of silicon dioxide. In addition or in the alternative, a dry etching process can be carried out in a gas-phase, with a chemical etching effect, a physical ion milling, and/or combinations thereof. In various embodiments, a plasma dry etching may utilize a partially ionized gas including F, Cl, O, H, and/or $CF_3$ radicals. The patterned photoresist layer 240 may be wet striped or ashed thereafter. Since the dielectric layer 230 is selectively etched through a photoresist pattern being reversed from the pattern of the underlying top conductive features 220 and the dummy conductive feature 225, the bumpy profile of the dielectric layer 230 is substantially reduced, polishing process is enhanced. An additional dielectric layer (not shown) such as a layer of the same material to the dielectric layer 230 may be further formed on the dielectric layer 230 thereafter. In one example, an additional silicon oxide layer may be applied on the dielectric layer 230 by a method similar to the method of forming the dielectric layer 230.

Figure 6:
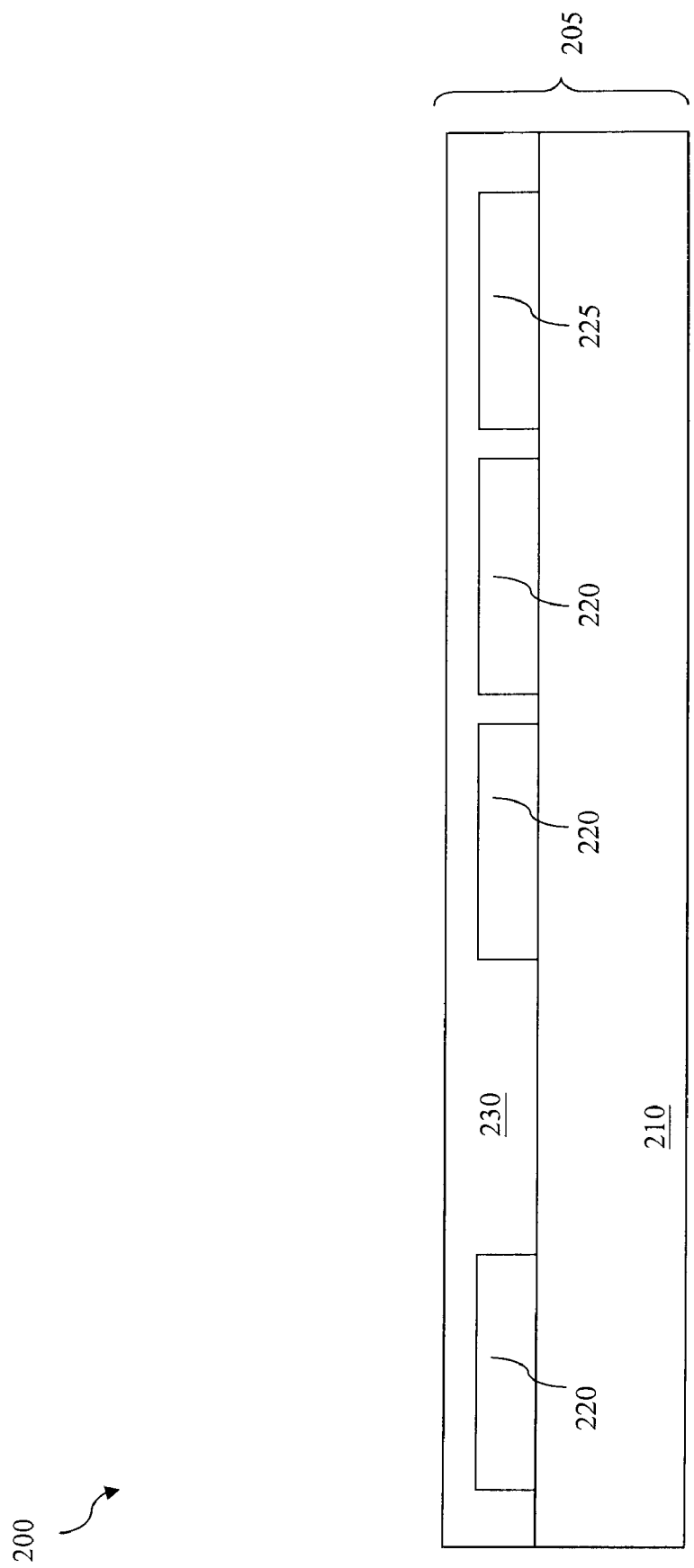

Referring to FIGS. 1 and 6, at step 110 of the method 100, a polishing process such as a chemical mechanical polishing (CMP) process is applied on the dielectric layer 230 to polish and further reduce the thickness thereof. For example, with the top conductive layer of about 8 K angstrom thickness and the dielectric layer of about 16K angstrom thickness, the CMP process may substantially further reduce the dielectric layer 230 within the target region of about 2 K~2.5K angstrom.

As an example, the CMP process is performed by mounting the substrate wafer face down on a carrier. The carrier is then pressed against a moving platen containing a polishing pad. The carrier itself is rotated. An abrasive-containing aqueous slurry is dripped onto the table, and centrifugal force distributes the slurry across the pad. The combination of mechanical effects and chemical reactions results in material removal from the surface of the substrate. Some other process such as an etching-back process may be alternatively or collectively utilized to achieve polishing and removal effect.

Figure 7:
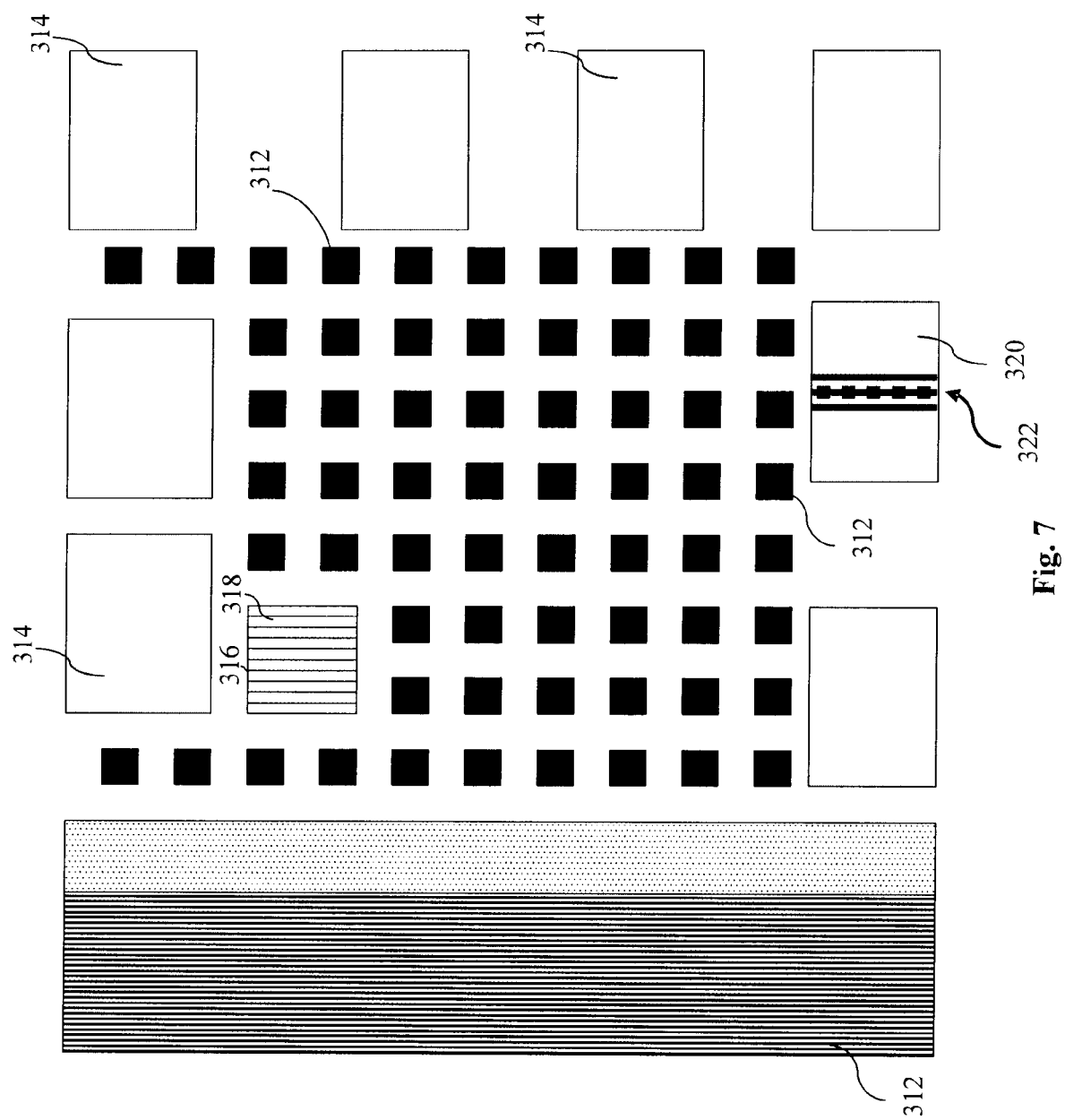
FIG. 7 illustrates a top view of one embodiment of a semiconductor wafer with device regions and dummy features constructed according to aspects of the current disclosure.

Referring now to FIG. 7, a top diagrammatic view of a semiconductor device 310 according to one aspect of the present invention is shown. Semiconductor device or chip 310 includes a plurality of device features 312 and dummy features 314. As described above, dummy features 314 are designed to improve CMP processing performance, substrate surface flatness, and wafer bonding quality. In accordance with one aspect of the present disclosure, two of the dummy features are patterned to provide in-chip CD and in-chip focus monitoring. In the illustrated example, dummy feature 316 includes a set of CD calibration lines 318 and dummy feature 320 includes a focus pattern 322 that is designed to provide an indication of the focus drifted by line width roughness (LWR). As illustrated, the CD calibration lines 318 are formed within the active region of the chip rather than in a scribe line. The focus pattern 322 is also fabricated in a dummy feature defined within the active region of the chip. The CD calibration lines 318 and focus pattern 322 are fabricated using known or to-be-developed fabrication processes.

Figure 8:
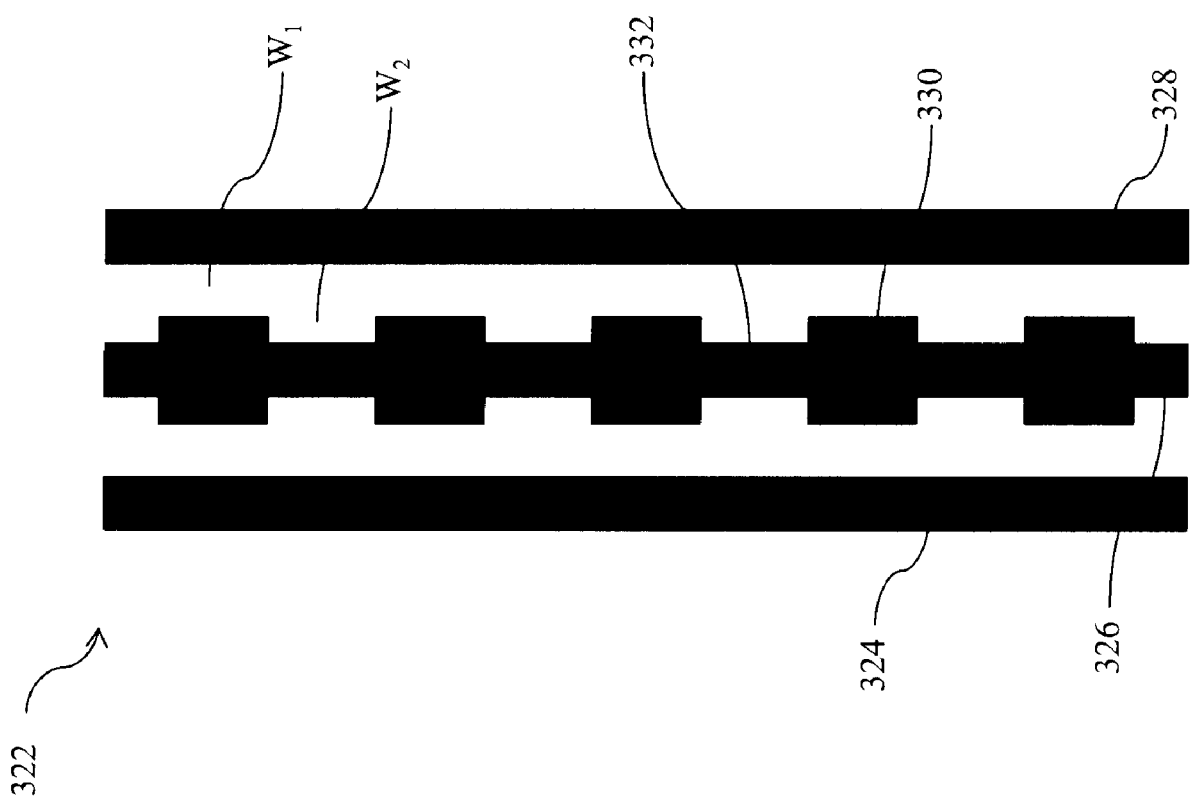
FIG. 8 is a top view of a focus pattern according to one aspect of the present disclosure.

The focus pattern 322 is further illustrated in FIG. 8. As shown thereat, the focus pattern includes three focus lines 324, 326, and 328. Focus lines 324 and 328 are calibration or reference lines each having a constant width whereas focus line 326 is constructed to have sections of varying width. More particularly, focus line 326 has first width sections 330 and second width sections 332 that are narrower than the first width sections 330. As will be explained in greater detail below, these differences in width are used to determine if the focus pattern is in, or out of, focus. That is, the focus pattern is used to measure the profile of the chip and determine if that profile is within desired tolerances.

Width sections 330 are spaced from focus lines 324 and 328 by a width $W_1$ and width sections 332 are spaced from focus lines 324 and 328 by a width $W_2$. The difference between $W_1$ and $W_2$ is used to determine if the focus pattern is out of focus. That is, a focus mask (not shown) used to define the focus pattern is constructed such that $W_1-W_2$ equals a desired focus metric. If the focus pattern formed on the chip is in focus, then $W_1-W_2$ will be equal to or approximate the focus metric. If the focus pattern is out-of-focus then the $W_1-W_2$ value will be greater than the focus metric. For example, given a focus metric of 0.12 microns, if the photolithography equipment and process used to fabricate the focus pattern are out of focus then $W_1-W_2$ will be larger than 0.12 microns.

In one embodiment, the focus pattern is formed and measured on the chip itself. In another embodiment, the focus pattern can be measured in a photoresist or other development layer. That is, after photoexposure and developing of the photoresist layer, which has been masked and developed to include the focus pattern, the focus pattern can be inspected and measured, as described above, to determine if the focus pattern is out of focus. In this regard, if the focus pattern is out of focus, the resist layer can be stripped, reformed, and redeveloped with appropriate adjustments to the masking and photolithography processes. It is contemplated that the focus pattern can be measured to determine its focus following photoresist developing, etching, or both, for example. It is also recognized that other focus patterns different or in addition to that shown in FIGS. 7-8 may be used. It is also contemplated that a chip or wafer may be fabricated to have multiple CD or focus patterns.

It is to be understood that the foregoing disclosure provides different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not itself dictate a relationship between various embodiments and/or configurations discussed.

What is claimed is:

1. A method of calibrating a semiconductor device fabrication process, comprising:
    forming a focus pattern on a semiconductor device layer, wherein the focus pattern has a first focus line spaced from a second focus line, and wherein the second focus line has a first width section spaced from the first focus line by a first width and a second width section spaced from the first focus line by a second width different in magnitude from the first width;
    determining a difference between the first and second widths;
    comparing the difference to a focus control metric; and
    determining focus quality of the semiconductor device layer from the comparison.

2. The method of claim 1 wherein the focus pattern is formed in a dummy feature of the semiconductor device layer.

3. The method of claim 1 wherein the semiconductor device layer is a patterned photoresist layer.

4. The method of claim 1 further comprising forming a critical dimension monitor pattern on the semiconductor device layer.

5. The method of claim 4 wherein the critical dimension monitor pattern is formed in a dummy feature of the semiconductor device layer.

6. The method of claim 1 further comprising stripping and re-forming the semiconductor device layer if the focus quality is unacceptable.

7. A method of patterning a semiconductor device layer, comprising:
providing a substrate;
forming a photoresist on the substrate;
patterning the photoresist to define a set of focus lines;
measuring the set of focus lines to determine a focus measurement;
comparing the focus measurement to an expected focus measurement; and
determining focus quality of the photoresist from the comparison.

8. The method of claim 7 further comprising stripping the photoresist and repeating the forming and patterning if the focus quality is unacceptable.

9. The method of claim 7 wherein patterning comprises exposing the photoresist with a photomask, wherein the photomask has a focus pattern template defining the expected focus measurement, and developing the exposed photoresist.

10. The method of claim 7 wherein patterning comprises defining an active area and a dummy feature, wherein the dummy feature is formed in the active area.

11. The method of claim 10 wherein the set of focus lines are formed in the dummy feature.

12. The method of claim 7 further comprising forming a set of critical dimension lines in the photoresist.

13. The method of claim 7 further comprising etching the substrate if the focus quality is acceptable, and further determining focus quality for the etched substrate by comparing a focus measurement of etched focus lines to the expected focus measurement.

14. The method of claim 7 further comprising automatically adjusting a photolithography system used to pattern the photoresist if the focus quality is unacceptable.

* * * * *